US005510154A

United States Patent [19]
Itoh et al.

[11] Patent Number: 5,510,154
[45] Date of Patent: Apr. 23, 1996

[54] LOW-VELOCITY ELECTRON EXCITED PHOSPHOR AND METHOD FOR PRODUCING SAME

[75] Inventors: Shigeo Itoh; Hitoshi Toki; Yoshihisa Yonezawa, all of Mobara, Japan

[73] Assignee: Futaba Denshi Kogyo K.K., Chiba, Japan

[21] Appl. No.: 160,166

[22] Filed: Dec. 2, 1993

[30] Foreign Application Priority Data

Dec. 3, 1992 [JP] Japan .................................. 4-324411
Dec. 14, 1992 [JP] Japan .................................. 4-352783

[51] Int. Cl.$^6$ ........................................................ B05D 3/06
[52] U.S. Cl. ................................................. 427/526; 427/523
[58] Field of Search .............................. 427/523, 529, 427/530, 526

[56] References Cited

U.S. PATENT DOCUMENTS

| | | | |
|---|---|---|---|
| 5,066,514 | 11/1991 | Oyoshi | 427/530 X |
| 5,075,130 | 12/1991 | Reeber et al. | 427/530 X |
| 5,098,813 | 3/1992 | Nakano et al. | 430/139 |
| 5,194,290 | 3/1993 | Robertson | 427/526 |

*Primary Examiner*—Nam Nguyen
*Attorney, Agent, or Firm*—Fisher & Associates

[57] ABSTRACT

A low-velocity electron excited phosphor capable of exhibiting increased luminance and a method for producing the same. A matrix crystal for the phosphor is doped therein with an activator at implantation energy of 50 KeV by ion implantation, resulting in the activator entering a portion of the matrix crystal extending to a depth as small as 0.5 μm from a surface thereof. Then, the phosphor is annealed for a reduced period of time as short as 10 seconds at a temperature of 900° C. Such short-time annealing effectively prevents distribution of the activator in the matrix crystal formed during the implantation from being deeply spread into the matrix crystal by thermal diffusion. Thus, the activator concentratedly exists at only a portion of the matrix crystal in proximity to the surface thereof. Thus, the phosphor exhibits increased luminance as compared with a prior art, because luminescence of the phosphor is limited to the portion thereof in proximity to the surface.

2 Claims, 13 Drawing Sheets

LOW-VELOCITY ELECTRON EXCITED PHOSPHOR AND METHOD FOR PRODUCING SAME

BACKGROUND OF THE INVENTION

This invention relates to a low-velocity electron excited phosphor used in a luminous display section of a fluorescent display device, and more particularly to a low-velocity electron excited phosphor produced by ion implantation and a method for producing the same.

A conventional method for producing a phosphor by ion implantation is disclosed in Japanese Patent Publication No. 17624/1978. An ion implantation apparatus used for practicing the method generally includes a vacuum unit in which a substrate having a matrix crystal for a phosphor deposited thereon in a predetermined pattern is received, an ion source section containing an activator, an ion drawing-out section for drawing out the activator ionized, and the like. The ion source section is adapted to produce vapor of the activator and ionize it, resulting in ion of the activator being produced. The ion drawing-out section and the like serve to impart kinetic energy to the ion to impinge it on the substrate, so that the so-formed ion of the activator is implanted in the matrix crystal for the phosphor. After implantation of the ion, the substrate is heated to a temperature of 1000° C. over a period of time as long as 1 hour or more, resulting in being subject to annealing. This leads to thermal diffusion of the activator into the matrix crystal.

The conventional method described above is adapted to treat the substrate on which the matrix crystal for the phosphor is deposited in a display pattern. Unfortunately, the conventional method fails to increase efficiency with which the substrate is treated, because the ion implantation apparatus is constructed so as to receive only one substrate therein for every treatment. Also, the conventional method fails to practice the annealing step at an increased rate of temperature rise. For example, a period of time as long as 1 hour or more is required for rising the temperature to a level of 1000° C. Also, cooling of the substrate thus heated which is carried out after it is kept at 1000° C. for a predetermined period of time requires a period of time as long as 1 hour or more. Thus, it will be noted that the conventional method leads to significant deterioration in operating efficiency.

Figure 12:
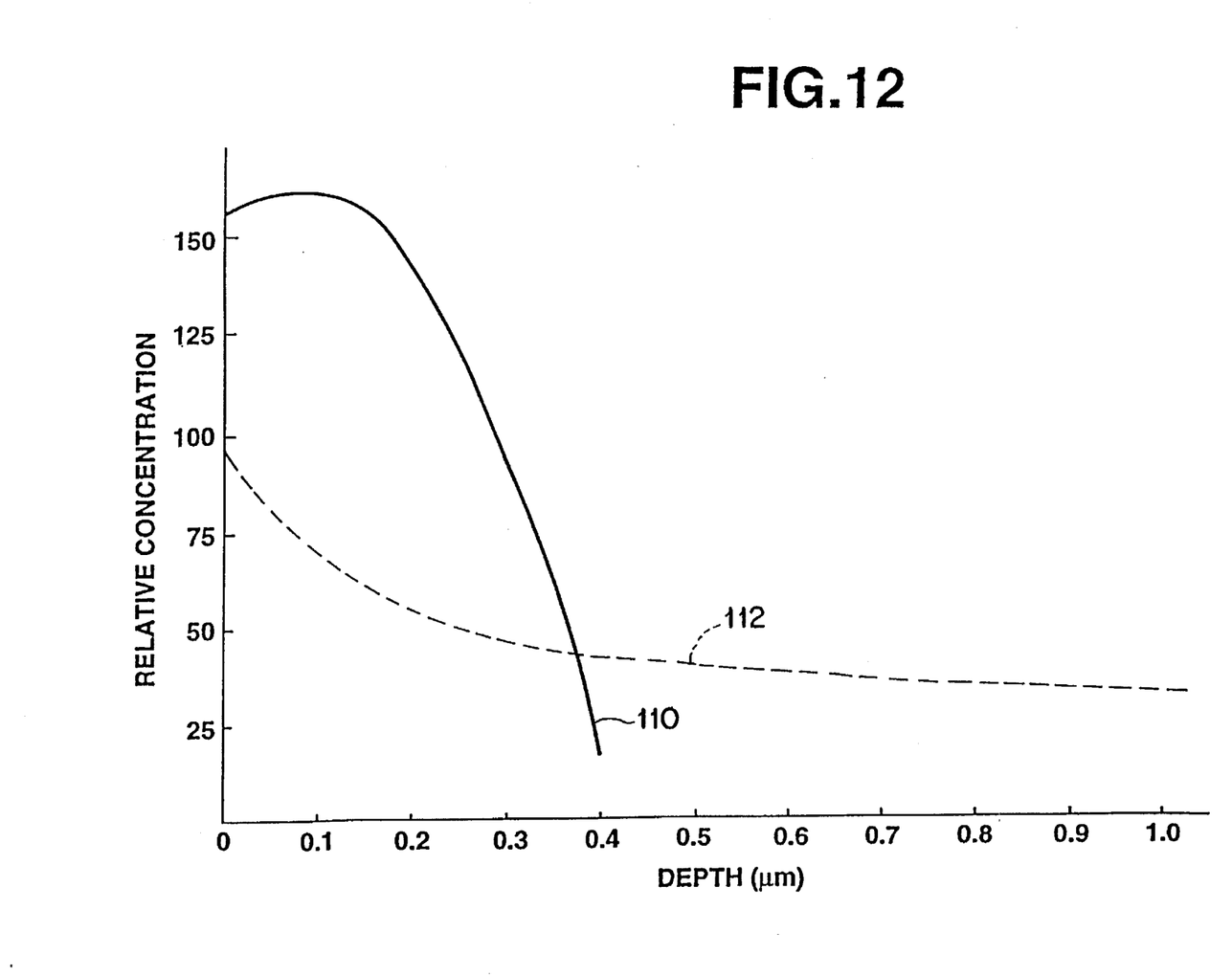
FIG. 12 is a graphical representation showing a relationship between a concentration of an activator doped in a matrix crystal and a depth of the matrix crystal from a surface thereof in the present invention while comparing with that in a prior art.

Further, the fact that the annealing step in the conventional method requires one hour or more for heating the substrate to a level of 1000° C. causes the activator implanted in the matrix crystal to be thermally diffused into the matrix crystal deeply. More particularly, as shown in FIG. 12, a conventional phosphor produced according to the above-described conventional method causes even a concentration of the activator implanted in a portion of the matrix crystal as deep as 1 μm from a surface thereof to be as large as about 30 supposing that a concentration of the activator on the surface of the phosphor is 100. In this respect, it is considered that when lower-velocity electrons accelerated at an acceleration voltage of at most about 100V such as electrons utilized in a fluorescent display device are impinged on the phosphor, only a portion of a phosphor extending to a depth as small as tens angstroms from a surface of the phosphor is excited due to the impingement. Thus, it is desirable that the activator acting to promote or control luminescence of the matrix crystal concentratedly exists at a portion of the matrix crystal extending to a small depth from a surface of the matrix crystal, therefore, the activator implanted or doped in a portion of the phosphor significantly apart from the surface thereof as in the prior art fully fails to contribute to luminescence of the phosphor.

The amount of activator implanted in a matrix crystal in manufacturing of a phosphor is extraordinarily increased as compared with, for example, the amount of P or the like implanted in Si in manufacturing of a semiconductor. Thus, in manufacturing of a phosphor by conventional ion implantation, it is desirable that a dose rate (ion current) is increased to a level as high as, for example, 10 μA, to thereby reduce a period of time required for ion implantation. However, ion implantation of the activator in the matrix crystal in the form of a powder at a high dose rate causes the matrix crystal to generate heat. Unfortunately, the so-generated heat is accumulated in the matrix crystal because it is in the form of a powder exhibiting low thermal conductivity, resulting in a surface of the phosphor being decomposed and/or melted.

In order to avoid such a disadvantage, it is proposed that the dose rate is set to a level as low as 1 μA to prevent the matrix crystal from generating heat. Unfortunately, this causes a period of time required for the ion implantation to be extraordinarily increased. For example, a period of time as long as about 40 hours is required to implant a Mn ion in a predetermined amount in a matrix crystal of $ZnGa_2O_4$.

SUMMARY OF THE INVENTION

The present invention has been made in view of the foregoing disadvantage of the prior art.

Accordingly, it is an object of the present invention to provide a low-velocity electron excited phosphor which is capable of permitting production of the phosphor to be carried out with increased operating efficiency.

It is another object of the present invention to provide a low-velocity electron excited phosphor which is capable of exhibiting increased luminance.

It is a further object of the present invention to provide a method for producing a phosphor which is capable of producing a low-velocity electron excited phosphor without deteriorating a surface condition of a matrix crystal for the phosphor.

It is still another object of the present invention to provide a method for producing a phosphor which is capable of producing a low-velocity electron excited phosphor in a significantly reduce period of time.

In accordance with one aspect of the present invention, a low-velocity electron excited phosphor provided. The phosphor comprises a matrix crystal and an activator for promoting luminescence of the matrix crystal. The activator is implanted in only a portion of the matrix crystal extending to a depth of 0.5 μm from a surface of the matrix crystal.

In accordance with another aspect of the present invention, a method for producing a low-velocity electron excited phosphor is provided. The method comprises the steps of doping an activator in a matrix crystal for the phosphor at implantation energy of 100 KeV or less by ion implantation and annealing, for 30 minutes or less, the phosphor which has been subject to the ion implantation.

In a preferred embodiment of the present invention, the ion implantation is carried out in an intermittent manner and the matrix crystal is cooled when the ion implantation is interrupted.

In the present invention constructed as described above, when the activator which has been doped in the matrix crystal for the phosphor from a surface thereof at implantation energy of 100 KeV or less by ion implantation is subject to the annealing treatment for a period of time as short as 30 minutes or less, it is caused to be concentratedly distributed in a portion of the matrix crystal extending to a depth as small as 0.5 μm from the surface thereof. Low velocity electrons generally can reach such a depth of the activator as described above. Thus, the phosphor is increased in luminescence due to impingement of low velocity electrons thereon as compared with the conventional phosphor.

Also, in the present invention, ion implantation of the activator in the matrix crystal for the phosphor is repeated in an intermittent manner or at predetermined time intervals. When the amount of activator to be implanted in each of implantation operations is determined to prevent a temperature of the matrix crystal from exceeding a melting point thereof and then the matrix crystal is cooled during every interruption of the implantation, a surface of the matrix crystal is prevented from melting, resulting in implantation of the activator in a required, amount being attained in a reduced period of time.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENTS

Now, the present invention will be described hereinafter with reference to the accompanying drawings.

Figure 1:
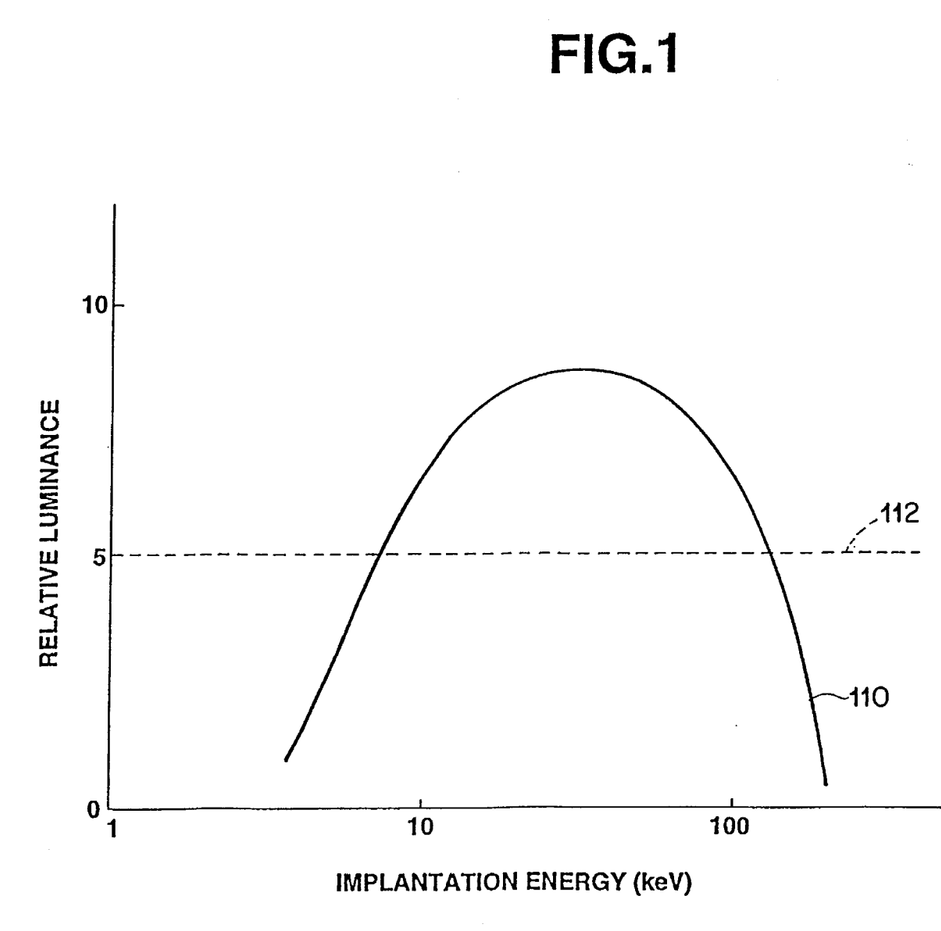
FIG. 1 is a graphical representation showing a relationship between relative luminance and implantation energy for indicating effective conditions in a first embodiment of the present invention while comparing with that in a prior art.
Figure 2:
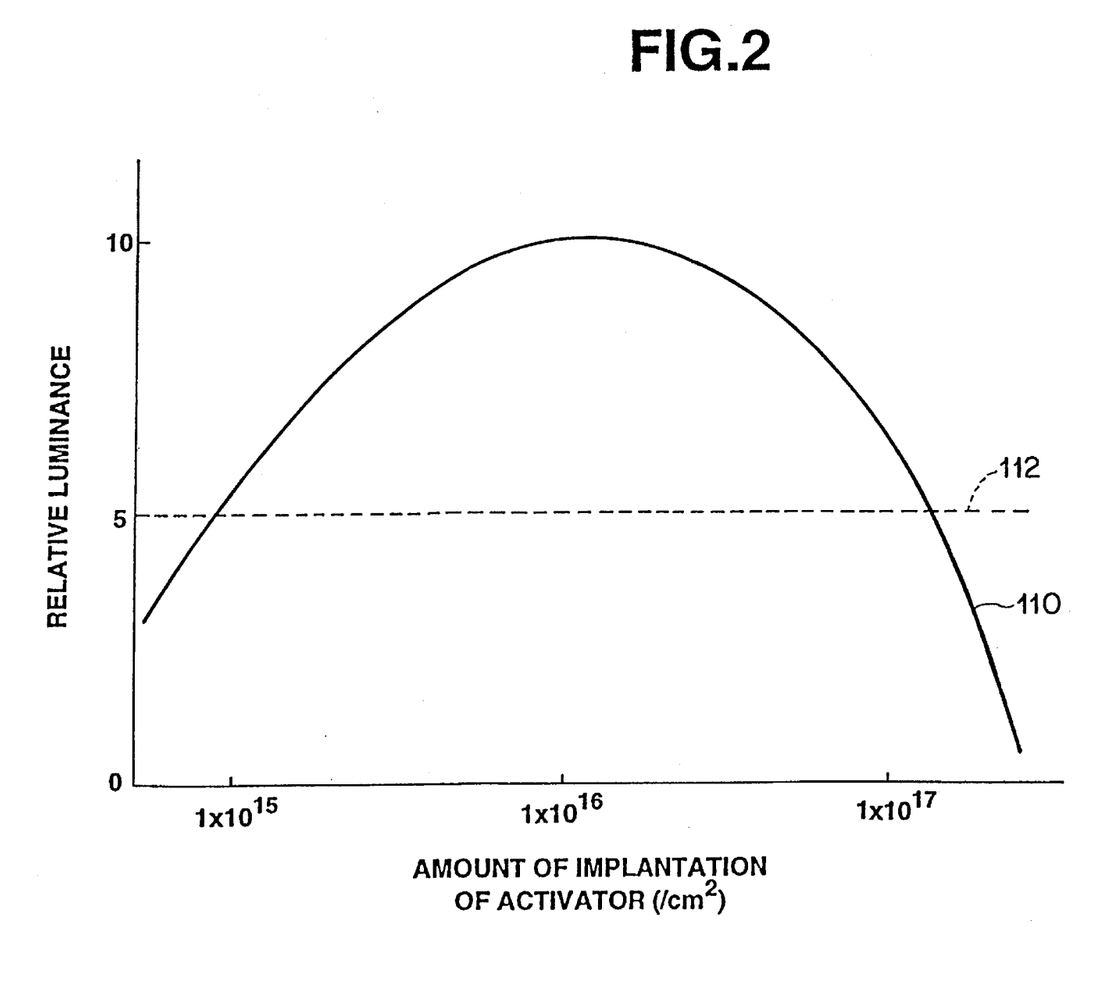
FIG. 2 is a graphical representation showing a relationship between relative luminance and the amount of implantation of an activator for indicating effective conditions in a first embodiment of the present invention while comparing with that in a prior art.
Figure 3:
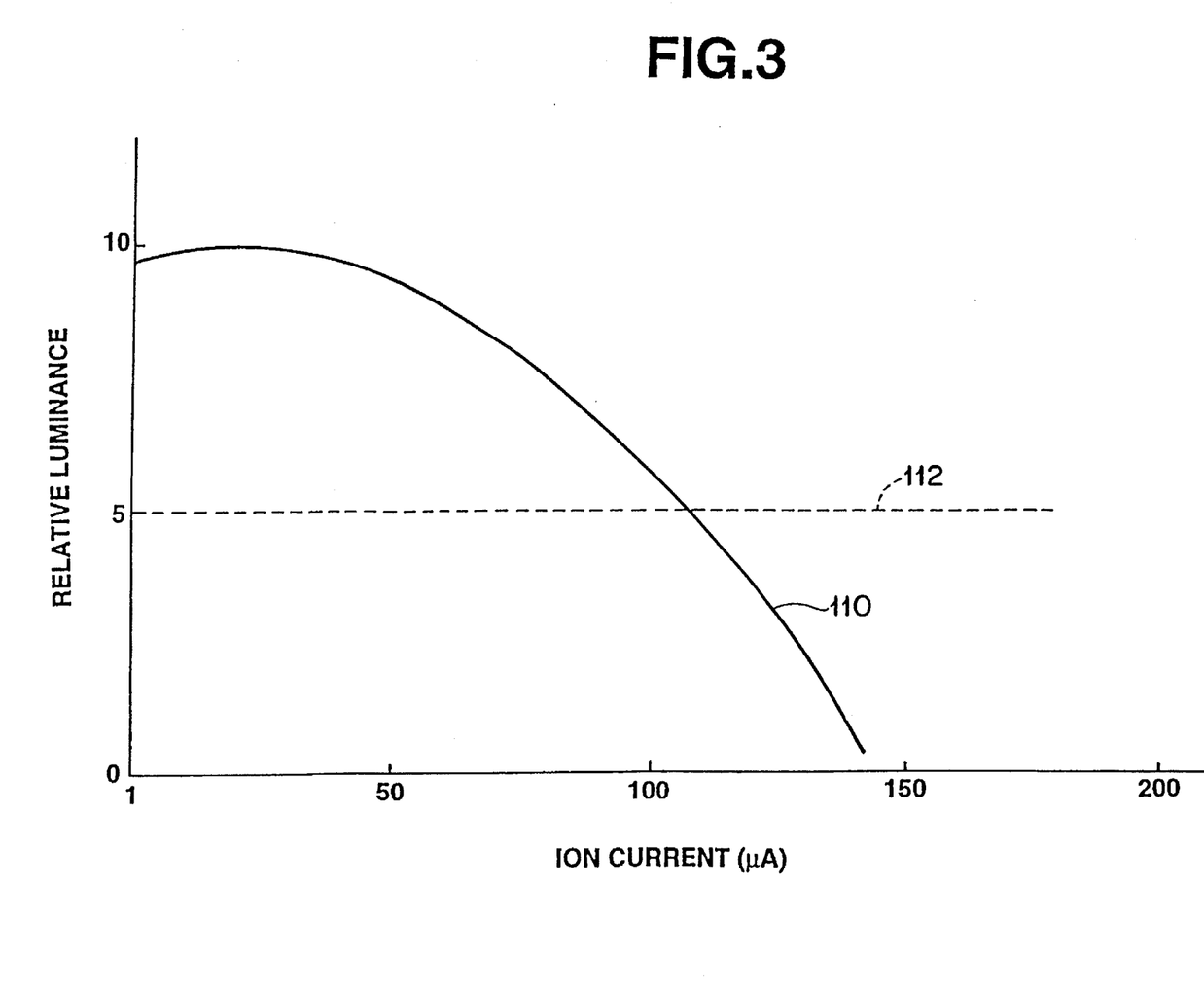
FIG. 3 is a graphical representation showing a relationship between relative luminance and an ion current for indicating effective conditions in a first embodiment of the present invention while comparing with that in a prior art.
Figure 13:
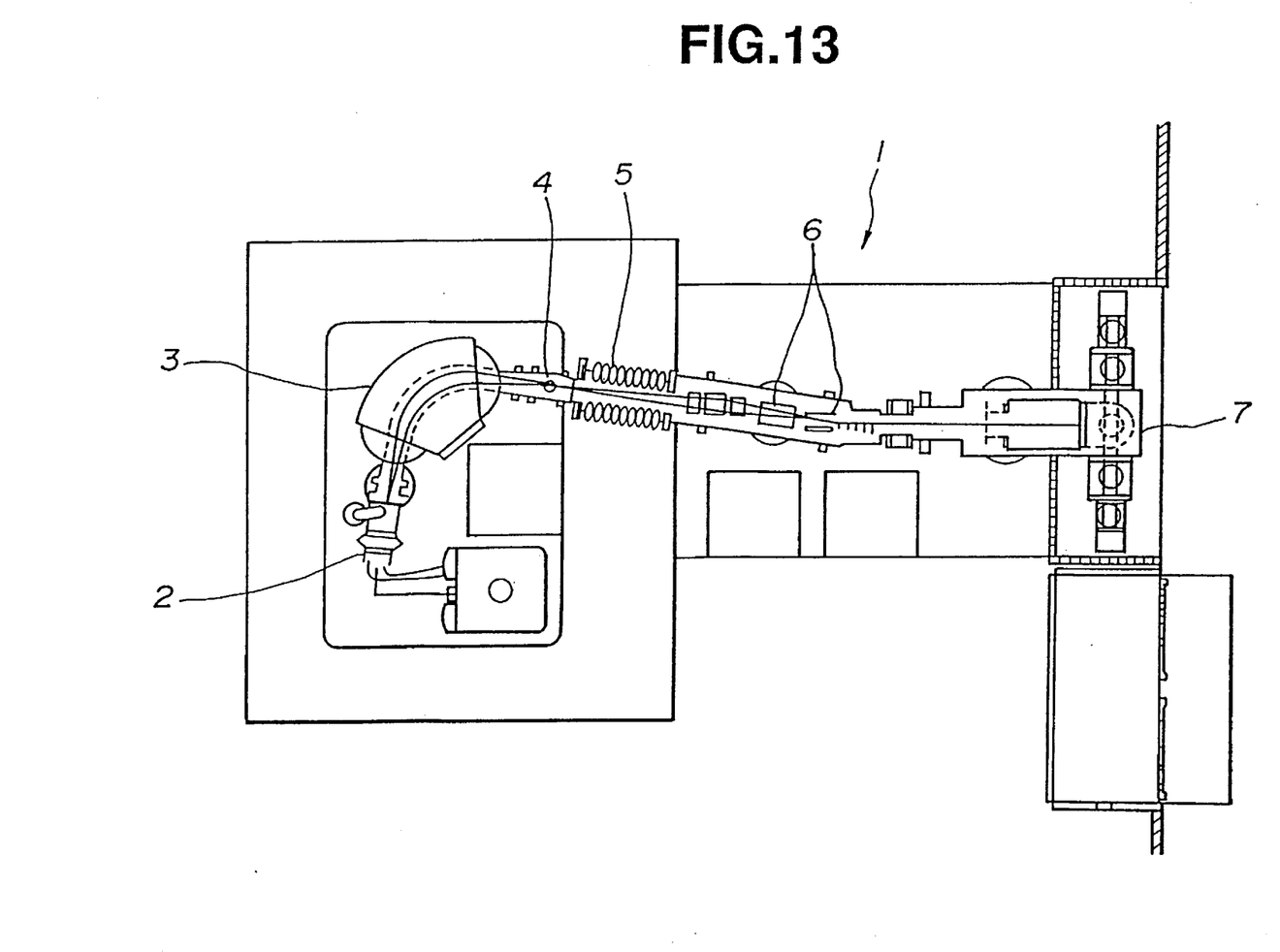
FIG. 13 is a schematic view showing an ion implantation apparatus suitable for use in the present invention.

Referring now to FIGS. 1 to 3, as well as FIGS. 12 and 13, a first embodiment of the present invention is illustrated, wherein a phosphor is produced by doping Mn acting as an activator for the phosphor in $ZnGa_2O_4$ serving as a matrix crystal for the phosphor by ion implantation. An example of an ion implantation apparatus suitable for use in the first embodiment is illustrated in FIG. 13, which apparatus is generally designated by reference numeral 1. The apparatus 1 generally includes an ion source 2, a mass spectrograph 3, a variable slit 4, an acceleration tube 5, an X-Y scanning section 6, and an end station 7 on which a target phosphor is set.

Now, production of $ZnGa_2O_4$ will be described hereinafter. First, zinc oxide and gallium oxide are mixed together to prepare a mixture. Then, the mixture is heated to a temperature of 1200° C. in an atmosphere and kept at the temperature for 1 to 6 hours, resulting in being calcined. Subsequently, the calcined product is subject to pulverization for 1 to 12 hours by means of a ball mill, to thereby obtain a $ZnGa_2O_4$ powder acting as the matrix crystal for the phosphor.

Then, the $ZnGa_2O_4$ powder is put in a stirrer and then placed on the end station 7 arranged in a vacuum unit of the ion implantation apparatus 1. A Freeman-type ion source in which Mn is placed is used as the ion source 2. An electron beam is irradiated to source gas sputter-discharged from the ion source 2 to ionize the source gas, resulting in obtaining an ion of the source gas. Then, a drawing-out voltage of 30 kV is applied to an ion drawing-out section to accelerate the ion.

Then, the mass spectrograph 3 is operated to extract $Mn^+$ from the ion drawn out. The extracted $Mn^+$ is then introduced through the variable slit 4 into the acceleration tube 5, to thereby be accelerated. Thereafter, the $Mn^+$ is guided through the X-Y scanning section 6 to the end station 7, resulting in being impinged on the matrix crystal contained in the stirrer placed on the end station 7.

Three factors comprising implantation energy, the amount of implantation of the activator (dosage), and an ion current (dose rate) are significant or important to ion implantation of the activator in the matrix crystal in the form of a powder.

Implantation energy is for ionizing and accelerating the element implanted in the matrix crystal. Adjustment of the implantation energy permits a distribution of the element in the matrix crystal in a direction of depth of the matrix crystal to be controlled. A unit of the implantation energy is "eV".

The amount of implantation of the activator (dosage) indicates the number of ions to be implanted. The unit is "/cm$^2$". In general, a range of $1\times10^{15}$/cm$^2$ or more is called a "high concentration", that of $10^{13}$/cm$^2$ to $10^{14}$/cm$^2$ is called an "intermediate concentration", and a range of $10^{12}$/cm$^2$ or less is called a "low concentration".

The ion current (dose rate) is a current derived from the ion source 2. The unit is "A".

In the illustrated embodiment, the implantation energy may be adjusted by an acceleration voltage applied to the acceleration tube 5. The ion current may be adjusted depending on a degree of opening of the variable slit 4 or by varying the amount of Mn$^+$ isolated or separated in the mass spectrograph 3. During the implantation, the matrix crystal in the form of a powder is stirred by the stirrer and an ion beam is uniformly scanned on the matrix crystal through the X-Y scanning section 6, to thereby ensure that the ion is uniformly implanted in the matrix crystal.

In the illustrated embodiment, conditions for the ion implantation may be determined so as to permit a phosphor capable of exhibiting satisfactory characteristics as compared with the conventional phosphor to be prepared.

More particularly, the implantation energy is set to be between 10 keV and 100 keV and preferably set to be 50 keV. The implantation energy below 10 keV tends to cause a surface of the powder to be sputtered during the implantation, resulting in crystallizability of the surface being deteriorated, whereas that above 100 keV tends to cause the implanted element to collide with the powder constituting elements, resulting in an increase in possibility that the powder constituting elements are displaced.

The amount of implantation of the activator (dosage) is set to be $1\times10^{15}$ to $1'10^{17}$/cm$^2$. The amount of doping thereof corresponds to a concentration of 0.03 to 3%.

The ion current (dose rate) is set to be 1 to 100 μA and preferably 10 μA.

The ion implantation carried out under such conditions as described above permits a suitable amount of Mn to be implanted in only a portion of the matrix crystal extending to a depth of 0.5 μm from a surface thereof. Thus, the conditions cooperate with a short-time annealing treatment which will be described hereinafter, to thereby provide a phosphor exhibiting excellent luminous characteristics.

After the ion implantation, an annealing treatment is carried out. A lamp annealing unit may be used for this purpose. The lamp annealing unit is constructed so as to place a specimen in a chamber kept at a desired atmosphere and subject it to a heat treatment by infrared heating using a lamp. The annealing treatment may be conducted under the following conditions:

Rate of temperature rise: 100° C./sec

Annealing temperature: 600° to 1000° C.

Annealing time: 10 seconds to 30 minutes

Annealing atmosphere: Vacuum ($10^{-2}$ to $10^{-5}$ Torr).

The reason that such a short-time annealing treatment can be made in the present invention would be that redistribution of the implanted element is minimized, to thereby permit damage of the phosphor occurring during the implantation to be restored. On the contrary, the conventional annealing treatment carried out at a reduced rate of temperature rise would cause an element distribution formed during implantation to be subject to displacement as in thermal diffusion, leading to deviation from an optimum quantity of the activator. Thus, the annealing treatment in the illustrated embodiment can be carried out at a rate of temperature rise significantly increased as compared with that in the prior art, as well as in a short period of time at a decreased temperature as compared with the prior art. This effectively prevents crystallizability of the surface of the phosphor from being deteriorated and permits Mn acting as the activator to be doped in a surface region of the phosphor. In other words, the annealing treatment carried out in the illustrated embodiment is not restricted by equilibrium of thermodynamic parameters such as a coefficient of diffusion, solid solubility and the like unlike the conventional annealing treatment; so that Mn may be concentratedly doped in a portion of the matrix crystal extending to a depth of 0.5 μm from the surface thereof as shown in FIG. 12. Thus, Mn exists at a portion of the matrix crystal in proximity to the surface which contributes to luminescence of a low-velocity electron excited phosphor, so that the low-velocity electron excited phosphor of the illustrated embodiment may exhibit high luminance.

FIGS. 1 to 3 show comparison between luminance of a phosphor produced according to the present invention and the conventional phosphor for the purpose of determining the above-described conditions which permit the phosphor of the present invention to exhibit advantages over the prior art.

FIG. 1 shows a relationship between implantation energy and relative luminance, wherein maximum luminance of a phosphor produced according to the conventional method 112 including a long-time thermal diffusion annealing step is supposed to be five (5). It will be noted that the phosphor of the illustrated embodiment is 110 increased in relative luminance, as compared with the prior art, under the conditions that the implantation energy is 10 to 100keV while the mount of implantation of the activator and the ion current are set to be $1\times10^6$/cm$^2$ and 10 μA, respectively.

FIG. 2 shows a relationship between the amount of implantation of the activator and relative luminance of the phosphor in the illustrated embodiment. It will be noted that the phosphor of the illustrated embodiment exhibits increased luminance when the amount of implantation of the activator is in the range of between $1\times10^{15}$/cm$^2$ and $1\times10^{17}$/cm$^2$ under the conditions that implantation energy and an ion current are set to be 50keV and 10 μA, respectively.

FIG. 3 shows a relationship between an ion current and relative luminance in the illustrated embodiment. It will be noted that the phosphor of the illustrated embodiment exhibits increased luminance as compared with the prior art when an ion current is within the range of between 1 μA and 100 μA under the conditions that the amount of implantation of the activator is $1\times10^{16}$/cm$^2$ and implantation energy is 50keV.

The illustrated embodiment permits operating efficiency to be increased as compared with the case that a matrix crystal formed into a predetermined pattern on a substrate is treated by an ion implantation apparatus, because ion implantation is carried out on particles of the matrix crystal.

Now, a second embodiment of the present invention will be described with reference to FIGS. 4 to 8. The second embodiment is featured in that ion implantation is intermittently carried out so as to permit an activator to be doped at an increased concentration in a powdery material of low thermal conductivity. More specifically, a Mn ion acting as an activator for promoting luminescence of ZnGa$_2$O$_4$ acting as a matrix crystal for a phosphor is subject to intermittent ion implantation.

Conditions for the intermittent ion implantation may be set as follows:

Acceleration voltage of Mn ion: 50keV

Ion current: 10 µA

Amount of activator continuously doped in each implantation operation: $1\times10^{15}/cm^2$ or 25 minutes at 10 µA (Total amount: $1\times10^{16}/cm^2$)

Time for cooling; 2 minutes

Total time for treatment: 4.5 hours

Figure 4:
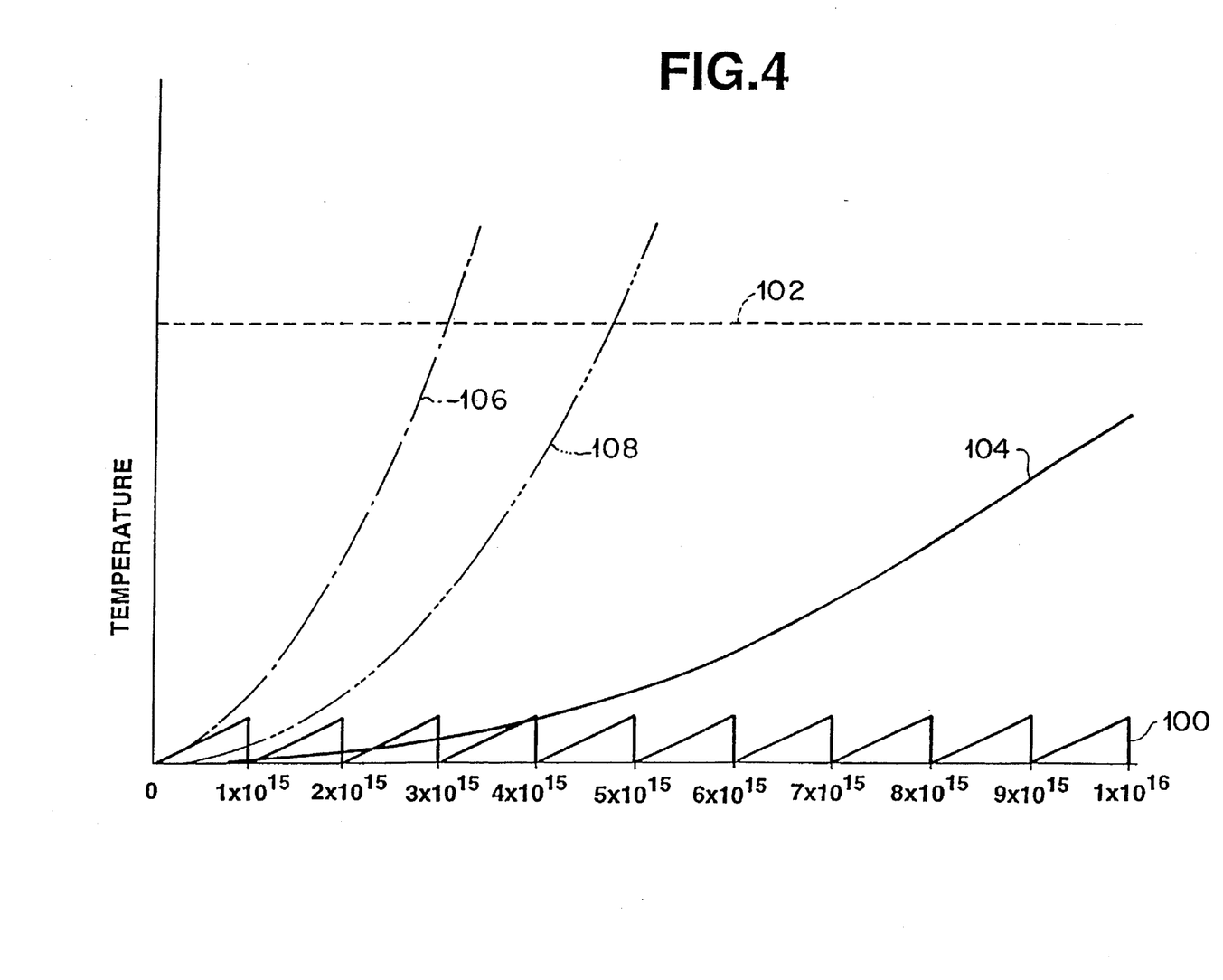
FIG. 4 is a graphical representation showing a relationship between the amount of implantation of an activator and a temperature in a second embodiment of the present invention while comparing with that in continuous implantation.

FIG. 4 shows a relationship between the amount of implantation of the activator and a temperature in the illustrated embodiment while comparing with a conventional continuous implantation method. It will be noted that the intermittent ion implantation 100 of the illustrated embodiment minimizes an increase in temperature of the matrix crystal in each implantation operation, so that the matrix crystal may be returned to its original temperature during the cooling. Thus, the intermittent ion implantation effectively prevents a temperature of the matrix crystal from exceeding a melting point thereof. On the contrary, continuous ion implantation of the activator at an ion current of 10 µA causes a temperature of the matrix crystal to exceed the melting point when the amount of implantation of the activator is about $5\times10^{15}/cm^2$, whereas that at an ion current of 100 µA causes the temperature to exceed the melting point when it is about $3\times10^{10}/cm^2$; thus, the continuous ion implantation does not prevent melting from occurring on a surface of the matrix crystal. Also, the continuous ion implantation at an ion current of 1 µA causes a temperature of the matrix crystal to be slightly lower than the melting point. Nevertheless, the temperature is significantly increased as compared with that obtained in the illustrated embodiment, so that the continuous ion implantation would not substantially prevent thermal deterioration of a surface of the matrix crystal. Further, as will be described hereinafter, the continuous ion implantation at an ion current as low as 1 µA causes total time for the treatment to be highly increased, so that it may not be put to practical use.

Figure 5:
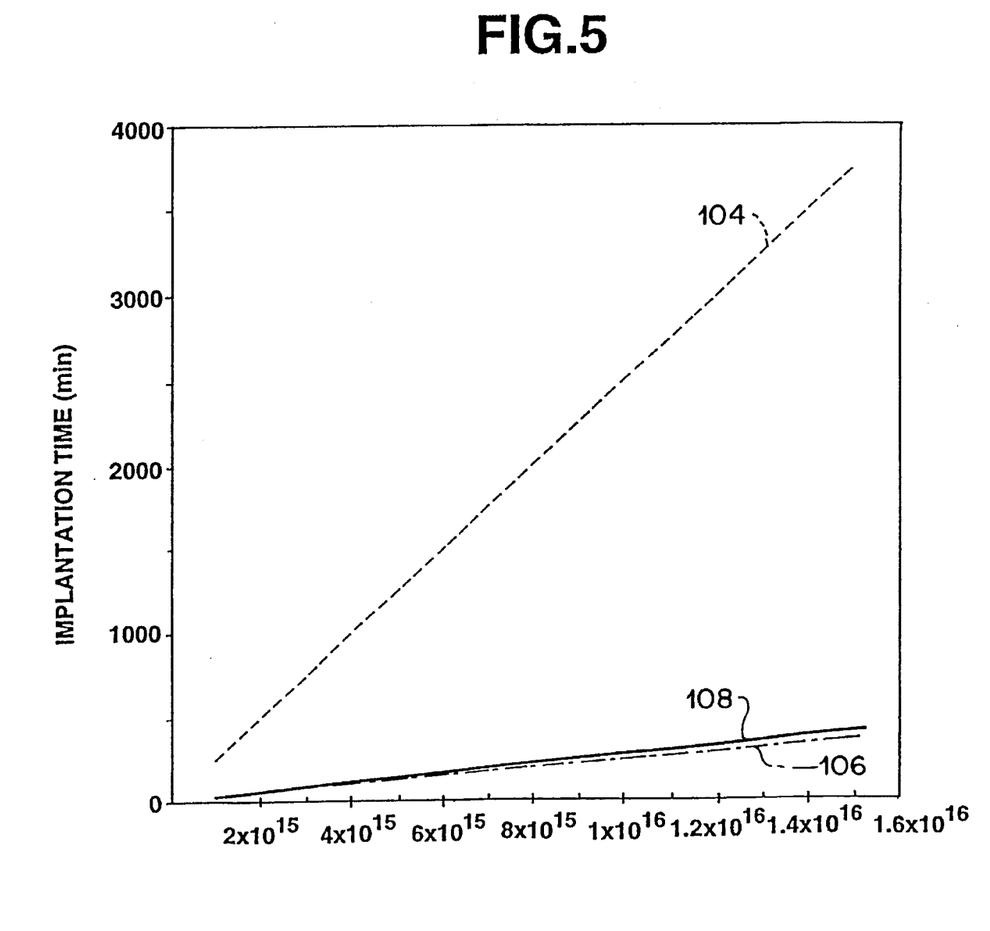
FIG. 5 is a graphical representation showing a relationship between the amount of implantation of an activator and time of the implantation in a second embodiment of the present invention while comparing with that in continuous implantation.

FIG. 5 shows a relationship between the amount of implantation of the activator and implantation time in the illustrated embodiment. The intermittent ion implantation 108 permits time required for implantation of the activation in a total implantation amount of $1\times10^{16}/cm^2$ to be substantially identical with time required in the conventional continuous ion implantation 106 at an ion current of 10 µA. On the contrary, the continuous ion implantation at an ion current of 1 µA, indicated by line 104, permits a temperature of the matrix crystal to be somewhat lower than the melting point as described above, however, it requires implantation time as long as about 2500 hours in order to obtain a total implantation amount of $1\times10^{16}/cm^2$, resulting in failing to be put into practical use.

Figure 6:
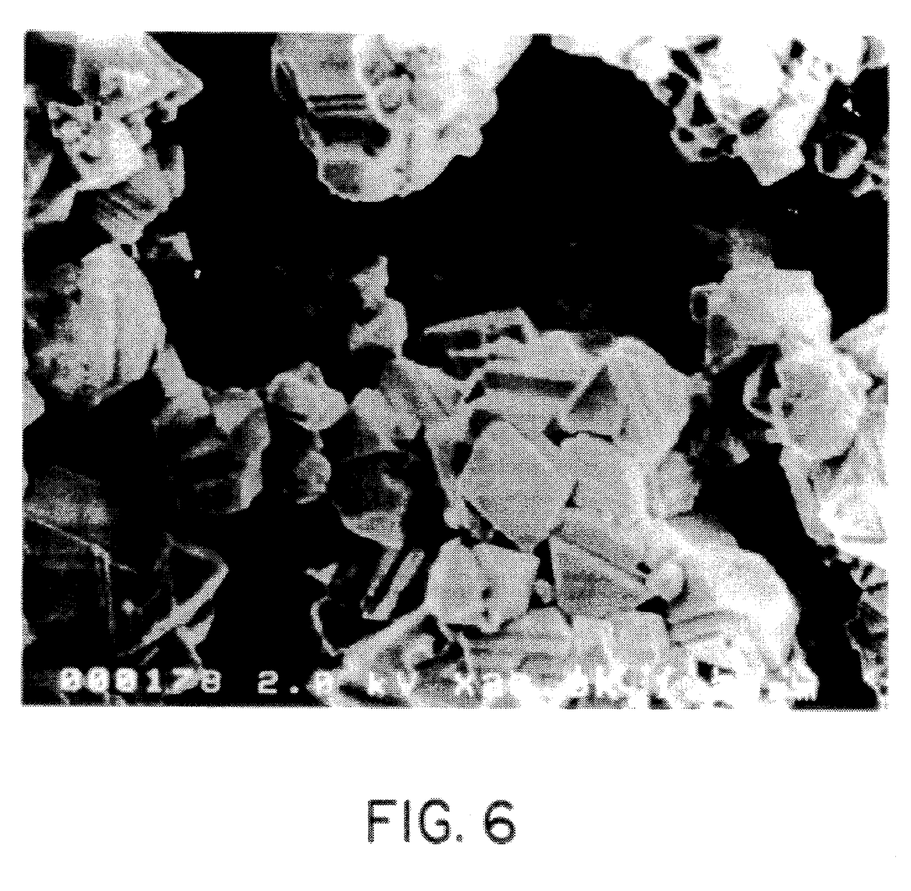
FIG. 6 is an SEM photograph showing a matrix crystal in a second embodiment of the present invention prior to ion implantation of an activator therein.
Figure 7:
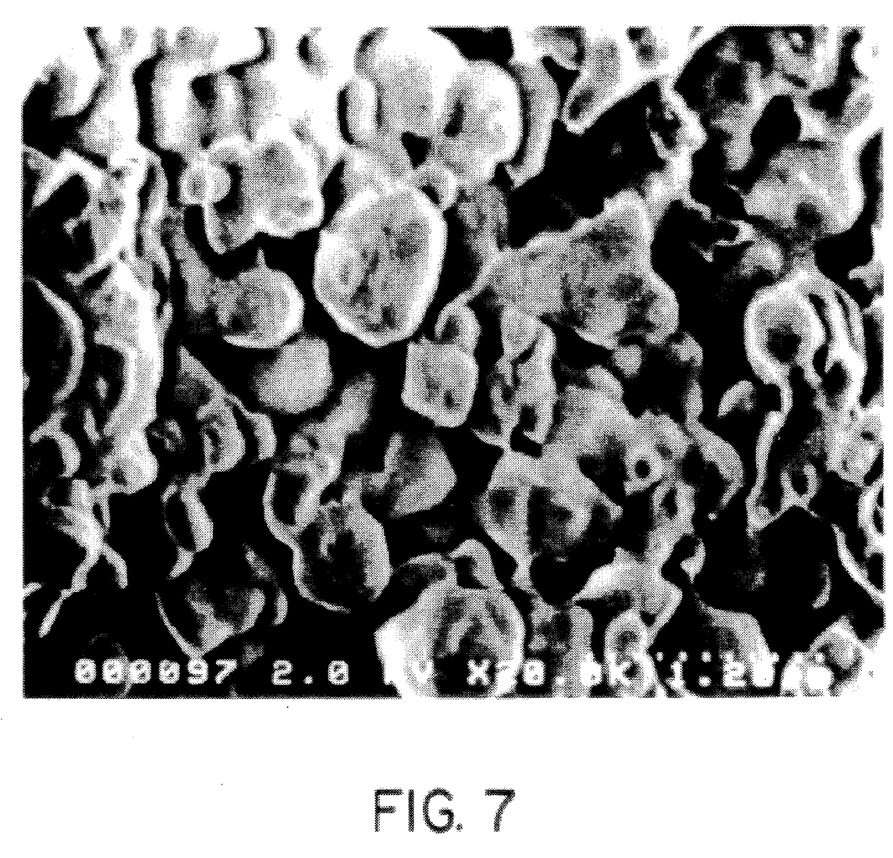
FIG. 7 is an SEM photograph showing a matrix crystal which has been subject to continuous implantation of an activator according to a prior art.
Figure 8:
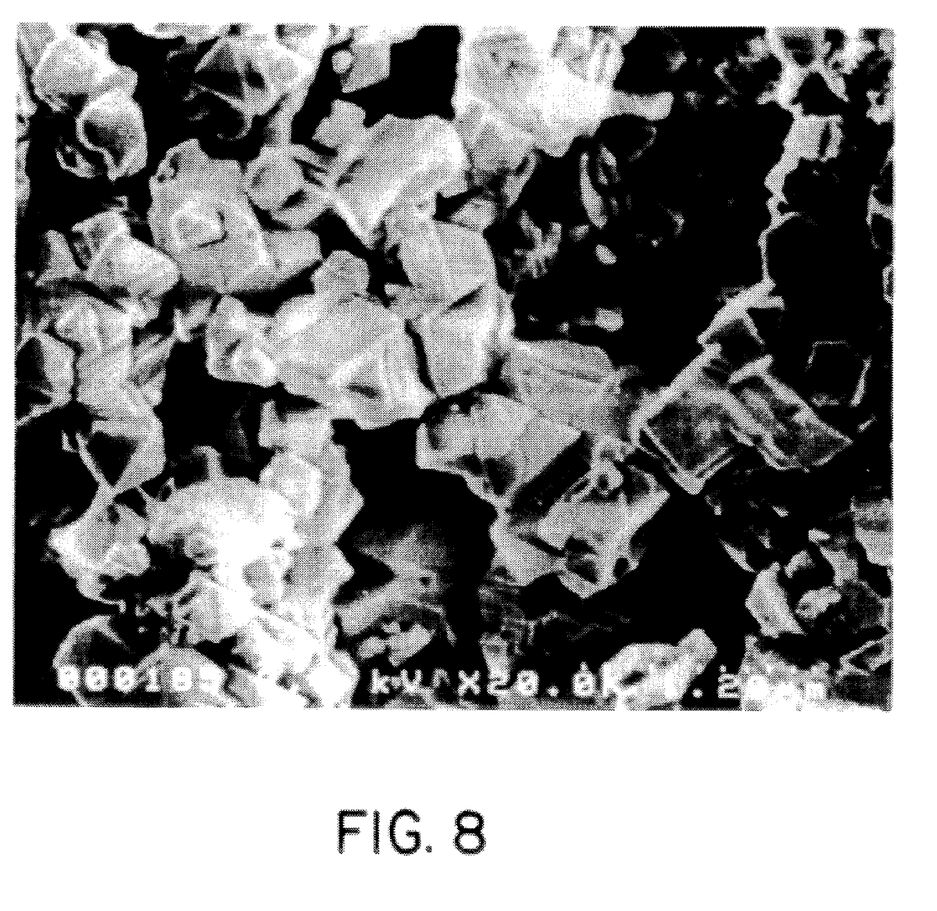
FIG. 8 is an SEM photograph showing a matrix crystal in a second embodiment of the present invention after intermittent implantation of an activator therein.

FIGS. 6, 7 and 8 each are an SEM photograph. FIG. 6 shows powdery $ZnGa_2O_4$ prior to ion implantation of the activator, FIG. 7 shows $ZnGa_2O_4$ which was subject to the conventional continuous ion implantation under the conditions that an ion current is 10 µA, the amount of implantation of the activator is $1.5\times10^{16}/cm^2$ and implantation time is set to be 250 minutes. FIG. 8 shows $ZnGa_2O_4$ which was subject to the intermittent ion implantation of the illustrated embodiment under the conditions that an ion current is 10 µA, the amount of implantation of the activator is $1.5\times10^{16}/cm^2$ and implantation time is 270 minutes.

As indicated in each of FIGS. 6 to 8, the continuous ion implantation causes a surface of the matrix crystal to be melted, whereas the intermittent ion implantation of the illustrated embodiment permits a surface of the matrix crystal to be kept at substantially the same state as that prior to the implantation.

$ZnGa_2O_4$ has a melting point of about 2000° C., therefore, melted powder shown in FIG. 7 is considered to be heated to a temperature more than 2000° C. during the ion implantation. The heat generation is considered to be carried out on a surface of the powder and a portion thereof in close proximity to the surface, so that heat is accumulated in particles of an outermost portion of the powder because a powder is generally poor in heat conduction. As a result, heat sufficient to cause a temperature of the powder to exceed the melting point is generated to melt the particles of the outermost portion of the powder. On the contrary, the intermittent ion implantation of the illustrated embodiment in which the ion implantation is interrupted every time when the activator is implanted in an amount which does not cause the temperature to exceed the melting point, to thereby release the heat accumulated effectively prevents melting of the matrix crystal.

Cooling of the phosphor is not limited to the manner used in the illustrated embodiment. Any other suitable cooling manner such as, for example, a procedure in which the heat is released by heat conduction by means of a rotary stirring jig for stirring the phosphor powder may be employed.

Now, a third embodiment of the present invention will be described hereinafter with reference to FIGS. 9 to 11. The third embodiment is constructed so as to dope ZnS acting as a matrix crystal for a phosphor with Ag acting as an activator for the phosphor by ion implantation to produce the phosphor. An apparatus and a procedure for manufacturing the phosphor may be identical with those used in the first embodiment described above. Conditions for the ion plantation may be set as follows:

Implantation energy: 1 to 100keV

Amount of Implantation of Activator: $1\times10^{14}$ to $1\times10^{15}/cm^2$

Ion current: 1 to 100 µA

Figure 9:
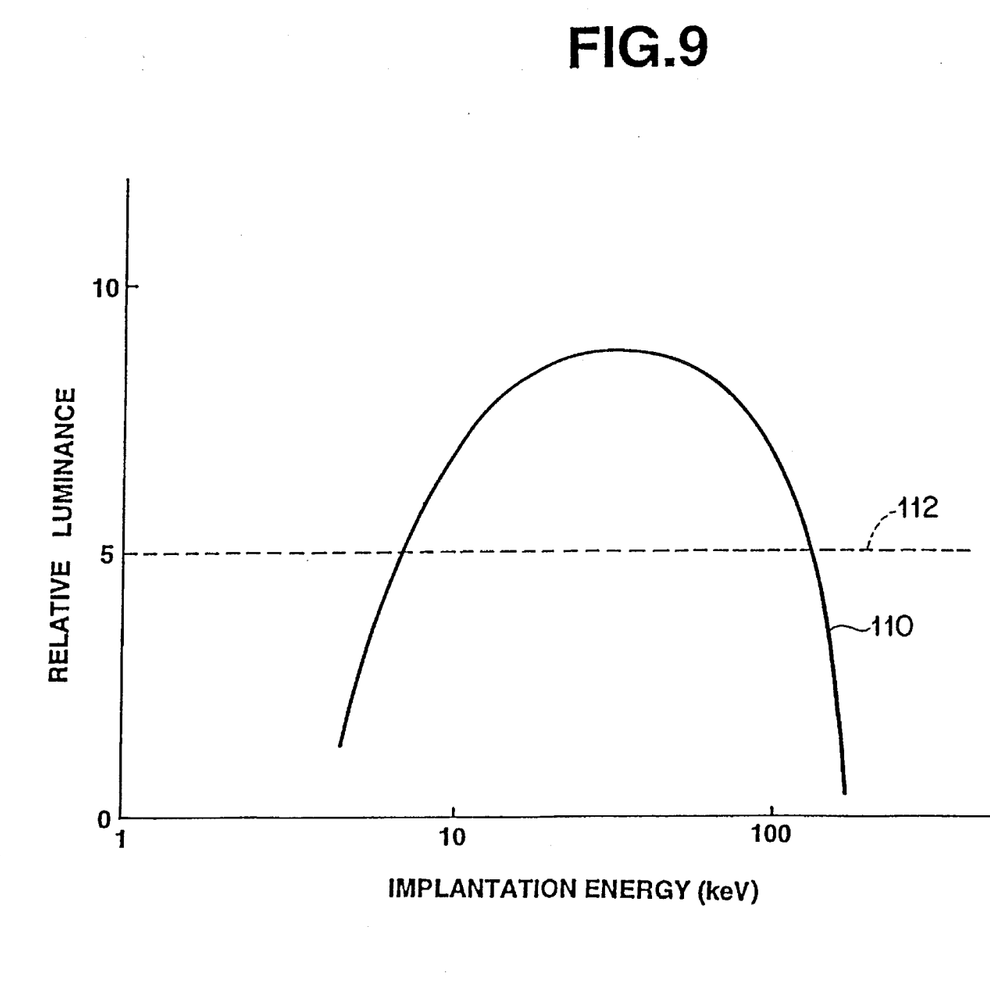
FIG. 9 is a graphical representation showing a relationship between relative luminance and implantation energy for indicating effective conditions in a third embodiment of the present invention while comparing with that in a prior art.
Figure 10:
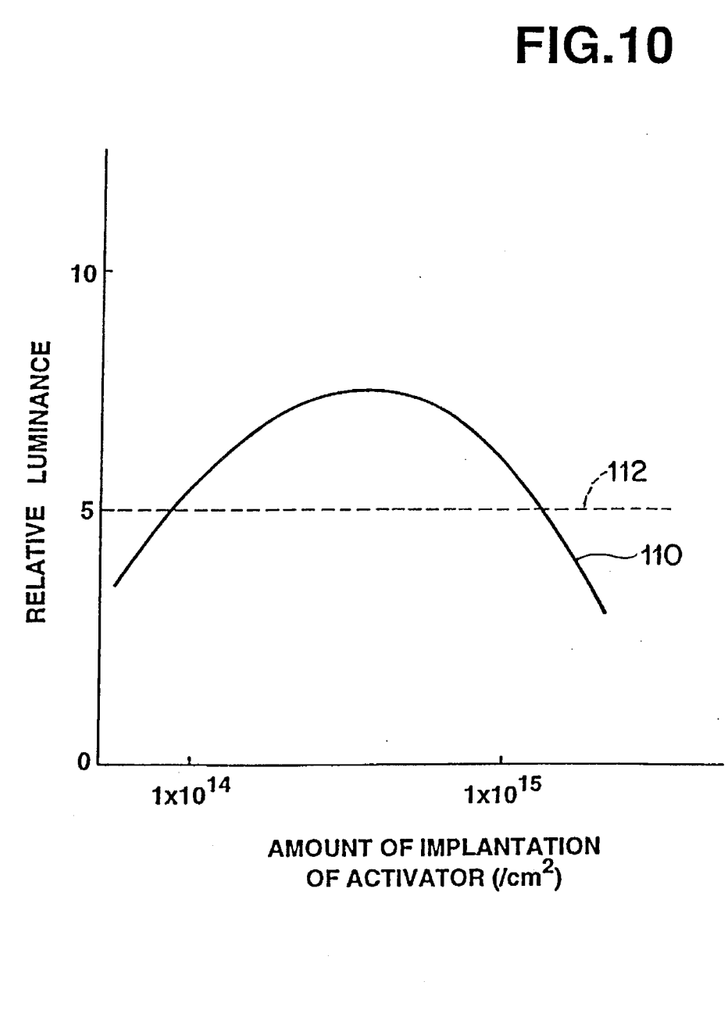
FIG. 10 is a graphical representation showing a relationship between relative luminance and the amount of implantation of an activator for indicating effective conditions in a third embodiment of the present invention while comparing with that in a prior art.
Figure 11:
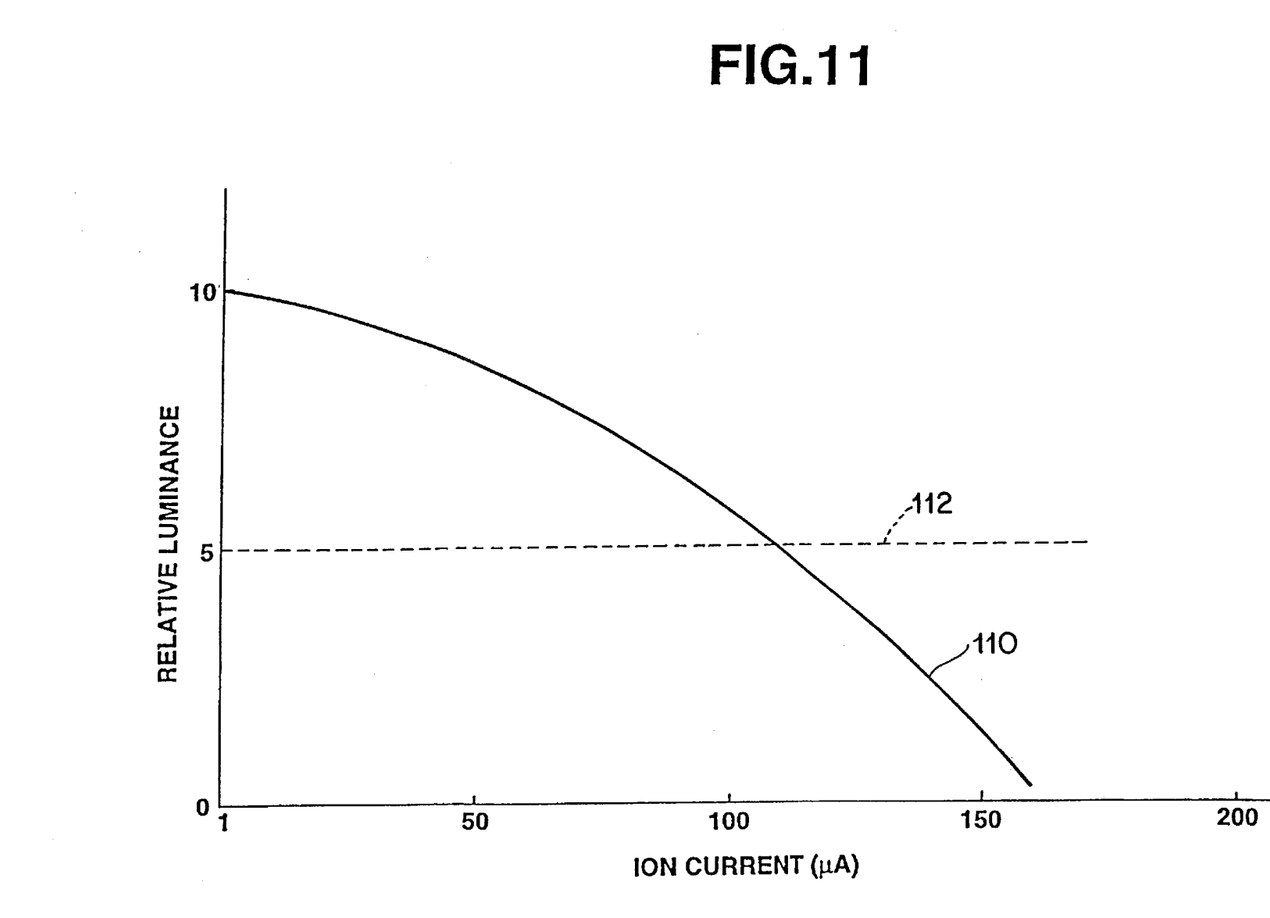
FIG. 11 is a graphical representation showing a relationship between relative luminescence and an ion current for indicating effective conditions in a third embodiment of the present invention while comparing with that in a prior art.

The ion implantation conditions described above were determined on the basis of experimental results shown in FIGS. 9 to 11 as in the first embodiment described above. The third embodiment exhibits substantially the same advantage as the first embodiment.

As can be seen from the foregoing, the method of the present invention is so constructed that the matrix crystal is doped with the activator at implantation energy of 100keV or less by ion implantation and then subject to the annealing treatment for a reduced period of time, resulting in producing the phosphor. Such construction permits the activator to exist at only an outermost region of the matrix crystal in proximity to a surface thereof, so that the phosphor may exhibit increased luminescence and satisfactory luminous characteristics.

Also, the present invention is constructed in the manner that the ion implantation of the activator in the matrix crystal for the phosphor is carried out in an intermittent manner, to thereby permit the phosphor to be cooled between the implantation steps. Thus, the present invention prevents accumulation of heat in the phosphor, so that ion implantation of the activator at a high concentration in the matrix crystal in the form of a powder which is decreased in thermal conductivity is accomplished without melting a surface of the matrix crystal and in a relatively short period of time.

While preferred embodiments of the present invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method for producing a low-velocity electron excited phosphor, comprising the steps of:
   doping an activator in a matrix crystal for said phosphor at an implantation energy of 100 keV or less by ion implantation; and
   annealing said phosphor implanted with said activator for 30 minutes or less whereby said activator is doped to be concentrated in said matrix crystal within a region of 0.5 μm from a surface of said matrix crystal of said phosphor.

2. The method recited in claim 1 wherein said ion implantation is carried out in an intermittent manner and said matrix crystal being cooled during interruption of said ion implantation.

* * * * *